United States Patent
Shyu

[19]

[11] Patent Number: 6,038,176

[45] Date of Patent: *Mar. 14, 2000

[54] PRESETTABLE SEMICONDUCTOR MEMORY DEVICE

[75] Inventor: Rong-Fuh Shyu, Hsinchu, Taiwan

[73] Assignee: Winbond Electronics Corporation, Hsinchu, Taiwan

[*] Notice: This patent is subject to a terminal disclaimer.

[21] Appl. No.: 09/178,872

[22] Filed: Oct. 26, 1998

Related U.S. Application Data

[63] Continuation-in-part of application No. 08/988,100, Dec. 10, 1997.

[51] Int. Cl.[7] .................................................. G11C 16/04
[52] U.S. Cl. ...................................................... 365/189.01
[58] Field of Search ........................ 365/189.01, 189.04, 365/203, 204, 230.05, 230.06

[56] References Cited

U.S. PATENT DOCUMENTS 5,875,131  2/1999  Shyu .................................. 365/189.01

*Primary Examiner*—David Nelms
*Assistant Examiner*—David Lam
*Attorney, Agent, or Firm*—Proskauer Rose LLP

[57] ABSTRACT

To configure a semiconductor memory device for presetting to a particular value without the need to write into each cell of a memory cell array, at least one controller is provided to address the array. The controller is responsive to preset, write and read control signals, and determines whether to keep an asserted state on a corresponding address select line of the array, or to force the corresponding address select line to a non-asserted state. Within the controller, at least one flag register is employed to indicate that a write operation has occurred for a corresponding word of the array. The flag register can be reset by means of the preset control signal. The controller will keep the asserted state on the corresponding address select line whenever the write control signal is asserted, and force the corresponding address select line to the non-asserted state when the read control signal is asserted and the corresponding address is not flagged. The controller further keeps the asserted state on the address select line when the flagged address is read. A setting cell is enabled by an enabling circuit when all the address select lines of the array are in the non-asserted state during a read cycle to output a fixed preset logic state.

32 Claims, 12 Drawing Sheets

PRESETTABLE SEMICONDUCTOR MEMORY DEVICE

CROSS REFERENCE TO RELATED APPLICATION

This application is a continuation-in-part (CIP) of U.S. patent application Ser. No. 08/988,100, entitled "Presettable Static RAM," the entire disclosure of which is incorporated herein by reference.

BACKGROUND OF THE INVENTION

1. Field of the Invention

The invention relates to a semiconductor memory device, such as a static random access memory (SRAM) device or a dynamic random access memory (DRAM) device. More specifically, the present invention relates to a semiconductor memory device that can be preset to a particular value without requiring an initial write operation for each cell of a memory cell array.

2. Description of the Related Art

Semiconductor memory devices, which offer a large storage capacity in a single chip at a reasonable cost, are widely used in electronic systems, such as computer, communication and consumer equipment. Recent advancements in semiconductor technology, most notably in the art of providing a complete system on a single chip, have made it possible to embed a memory device in an integrated circuit that functions as a complete system with a large data storage capability. The embedded technology further widens the field of applications for semiconductor memory devices, and can provide flexible granularity for each specific application.

Many applications, such as digital video compression, require a random access memory (RAM) array to be preset to a particular value. That is, each cell in the RAM array, such as an SRAM or DRAM array, is set to a logic 0 or a logic 1 by a write command. If the cells are preset sequentially by a series of write commands, the process can be very time consuming, especially for high density memory cell arrays. On the other hand, if all the cells in a high density memory array are simultaneously preset, such as by turning on all the address lines of the memory array and writing a logic 0 or a logic 1 therein, the resultant current surge can generate a significant amount of power noise on the power supply rail. This power noise may cause significant malfunctions in both digital and analog components, as well as inadvertent data alterations in various memory components of the system. Since industry trends require continuing increases in the number of memory bits per chip, thus increasing the density requirements of semiconductor memory arrays, it is incumbent upon the chip designer to develop presetting techniques for high density memory arrays which are not excessively time consuming, and which do not cause the undesirable current surge problem noted above.

FIG. 1 shows a typical prior art RAM structure, configured with p words and q bits. Each word represents an access unit. In this example, q parallel bits are simultaneously accessed in response to a read or write operation. The RAM device comprises an address decoder 1 and an array 2 having an input/output (I/O) gateway 3. The array 2 has p by q entries. A single bit, e.g. BIT0 20, comprises p cells of different addresses and companion devices on internal data lines for facilitating data access. Address decoder 1, in response to an address bus, decodes address lines for the p words. I/O gateway 3 has q cells, each of which is associated with a single bit, and provides a data path for writing data from a data bus to array 2, and also for reading data from array 2 to the data bus.

FIG. 2 shows address decoder 1 and a single bit 20 of an SRAM array according to FIG. 1 in greater detail. The array cells of single bit 20 are organized into m rows and n columns, where m×n=p. Address decoder 1 is divided into a row address decoder 11 and a column address decoder 12. Row address decoder 11 decodes m row select lines X0, X1, ... Xm−1 for the m rows. Column address decoder 12 decodes n column select lines Y0, Y1, ... Yn−1 for the n columns. Array cells of a same row share, and are cascaded by, a row select line e.g. X0. Array cells of a same column are shunted along a pair of data lines, e.g. C0 and CN0. The data line pairs of the n columns are combined into a pair of bit lines, B and BN, by n switches, each of which corresponds to one of the n columns. Each column select line Y0, Y1, ... Yn−1 outputted from column address decoder 12 controls the turning on or turning off of the corresponding switch. Each data line pair C0, CN0; C1, CN1; ... Cn−1, CNn−1 is charged by a pre-charge cell, e.g. 201, which equalizes both data lines to a certain voltage level when no access event occurs. A pre-charge cell 202 performs the same voltage equalizing function on the pair of bit lines B, BN. An I/O circuit 203, in response to a write control signal, passes data on the data bus to the bit lines B, BN. In response to a read control signal, I/O circuit 203 senses the voltage difference between the bit lines B, BN, and outputs a definite logic state to the data bus.

Each array cell of the SRAM array is typically a six-transistor or a four-transistor memory cell within a CMOS circuit. Each switch is typically an NMOS pass transistor. The pairs of data lines Cj, CNj (where j=0 to n−1) and the pair of bit lines B, BN are complementary. I/O circuit 203 typically contains an input buffer and a sense amplifier operating exclusively in respective write and read access cycles. The pre-charge cells, e.g. 201 and 202, and the I/O circuit 203 form parts of the I/O gateway 3.

FIG. 3 shows address decoder 1 and a single bit 20a of a DRAM array according to FIG. 1 in greater detail. The array cells of single bit 20a are also organized into m rows and n columns, where m×n=p. Like the address decoder 1 of FIG. 2, the row address decoder 11 decodes m row select lines X0, X1, ... Xm−1 for the m rows, whereas the column address decoder 12 decodes n column select lines Y0, Y1, ... Yn−1 for the n columns. Array cells of a same row share, and are cascaded by, a row select line e.g. X0. Unlike the single bit 20 of FIG. 2, array cells of a same column are connected to only one of a pair of data lines, e.g. C0 and CN0. The data line pairs of the n columns are combined into a pair of bit lines, B and BN, by n switches, each of which corresponds to one of the n columns. Each column select line Y0, Y1, ... Yn−1 outputted from column address decoder 12 controls the turning on or turning off of the corresponding switch. Like the single bit 20 of FIG. 2, each data line pair C0, CN0; C1, CN1; ... Cn−1, CNn−1 is charged by a pre-charge cell, e.g. 201a, which equalizes both data lines to a certain voltage level when no access event occurs. Each data line pair incorporates a sense amplifier, e.g. 204, to sense the voltage difference during a read access cycle. I/O circuit 203a, in response to a write control signal, passes data on the data bus to bit lines B, BN. In response to a read control signal, I/O circuit 203a senses the voltage difference between the bit lines B, BN, and outputs a definite logic state to the data bus.

Each array cell of the DRAM array is typically a single-transistor DRAM cell that includes a select transistor and a capacitor for charge storage. Each switch is typically an NMOS pass transistor. The pairs of data lines Cj, CNj (where j=0 to n−1) and pair of bit lines B, BN are complementary. I/O circuit 203a typically contains an input buffer and a sense amplifier operating exclusively in respective write and read access cycles.

In FIGS. 2 and 3, in the special case where n=1, the array cells are constructed as p rows by one column, and the switches and the column address decoder 12 can be omitted. The data lines Cj, CNj represent exactly the bit lines B, BN of the array cells such that only one sense amplifier is needed to detect the output state of the bit lines B, BN.

As stated above, presetting each array cell sequentially can be very time consuming, whereas simultaneous presetting or simultaneous resetting or clearing of the array cells may generate current surge noise problems.

One prior art technique to overcome the current surge problem when simultaneously resetting or clearing multi-byte data is described in U.S. Pat. No. 5,212,663. In this patent, an array of flag bits is added to the memory cell array of an SRAM device such that each word line of the memory cell array is associated with a corresponding flag bit. The flag bits are simultaneously reset to a logic "1" state at the instant power is restored to the SRAM device. A reset control circuit is used to create a logical relationship between the flag bits and the data in the memory cell array so that the resettable SRAM device presents a logic "0" output for all bits of the selected data when the corresponding flag bit is set to the logic "1" state, irrespective of the actual content of the memory cells. Thus, the need to reset all of the memory cells in the memory array is eliminated through the use of the flag bits.

This prior art technique, however, is only directed to the resetting of the entire SRAM array and does not allow for presetting of the SRAM array to a particular value without an initial write operation to each cell of the SRAM array.

DRAM cells are known to leak off stored charges to eventually change into an equivalent low level state unless a refresh operation is conducted periodically. However, allowing the DRAM cells to leak off stored charges does not result in presetting of the DRAM cells to a logic high level state.

SUMMARY OF THE INVENTION

The main object of the present invention is to provide a semiconductor memory device that can be preset to a particular value without requiring an initial write operation for each cell of a memory cell array.

Another object of the present invention is to provide a semiconductor memory device that can overcome the problems of excessive time consumption (sequential preset) and noise generation from current surges (simultaneous preset), as described above.

According to an illustrative preferred embodiment of the present invention, a presettable semiconductor memory device comprises an array of memory cells, a row address decoder, a column address decoder, a number n of setting cell circuits, a number m of row controller circuits, and an enabling circuit. The array of memory cells is arranged in m rows and n columns. Each of the n columns has a corresponding set of data lines. The row address decoder outputs row select signals. The column address decoder is connected to the array of memory cells, and outputs column select signals that are used to control switching of the sets of data lines of the n columns of memory cells to a common set of bit lines. Each of the setting cell circuits is connected to the data lines of a corresponding one of the n columns of memory cells. The setting cell circuits are capable of being enabled to output a preset logic state value to the data lines of the corresponding one of the n columns of memory cells. The row controller circuits are connected to the array of memory cells, the row address decoder and the column address decoder. The row controller circuits correspond to the m rows of memory cells and are responsive to the row and column select signals to control access to the m corresponding rows of memory cells. Each of the row controller circuits maintains the corresponding one of the m rows of memory cells in an asserted state upon sensing a write operation for the corresponding one of the m rows of memory cells, and upon sensing a read operation for the corresponding one of the m rows of memory cells subsequent to the write operation. Each of the row controller circuits forces the corresponding one of the m rows of memory cells to a non-asserted state upon sensing a read operation for the corresponding one of the m rows of memory cells when no previous write operation has taken place for the corresponding one of the m rows of memory cells. The enabling circuit is connected to the setting cell circuits and the row controller circuits. The enabling circuit disables the setting cell circuits so that data can be written into and read from the array of memory cells when any one of the m rows of memory cells is in the asserted state. The enabling circuit enables the setting cell circuits so that the preset logic state value is output to the data lines when all of the m rows of memory cells are in the non-asserted state during a read cycle.

According to another illustrative preferred embodiment of the present invention, a presettable semiconductor memory device comprises an array of memory cells, a row address decoder, a column address decoder, a number n of column controller circuits, a setting cell circuit, and an enabling circuit. The array of memory cells is arranged in m rows and n columns. Each of the n columns has a corresponding set of data lines. The row address decoder is connected to the array of memory cells, and outputs row select signals to control access to the m corresponding rows of memory cells. The column address decoder outputs column select signals. The column controller circuits are connected to the array of memory cells, the row address decoder and the column address decoder. The column controller circuits correspond to the n columns of memory cells and are responsive to the row and column select signals to control access to the n corresponding columns of memory cells and to control switching of the sets of data lines of the n columns of memory cells to a common set of bit lines. Each of the column controller circuits controls the switching of the sets of data lines for connection of one of the sets of data lines to a common set of bit lines upon sensing a write operation for the corresponding one of the n columns of memory cells, and upon sensing a read operation for the corresponding one of the n columns of memory cells subsequent to the write operation. Each of the column controller circuits further controls the switching of the sets of data lines for disconnection one of the sets of data lines from the bit lines upon sensing a read operation for the corresponding one of the n columns of memory cells when no previous write operation has taken place for the corresponding one of the n columns of memory cells. The setting cell circuit is connected to the bit lines and is capable of being enabled to output a preset logic state value to the bit lines. The enabling circuit is connected to the setting cell circuit and the column controller circuits. The enabling circuit disables the setting cell circuit so that data can be written into and read from the array of memory cells when any one of the sets of data lines is switched for connection with the bit lines. The enabling circuit enables the setting cell circuit so that the preset logic state value is output to the bit lines when all of the sets of data lines are switched for disconnection from the bit lines during a read cycle.

According to still another illustrative preferred embodiment of the present invention, a presettable semiconductor memory device comprises an array of memory cells, a row address decoder, a setting cell circuit, a number p of row controller circuits, and an enabling circuit. The array of memory cells is arranged in p rows and one column. The column has a corresponding set of data lines. The row address decoder outputs row select signals. The setting cell circuit is connected to the data lines and is capable of being enabled to output a preset logic state value to the data lines. The row controller circuits are connected to the array of memory cells and the row address decoder. The row controller circuits correspond to the p rows of memory cells and are responsive to the row select signals to control access to the p corresponding rows of memory cells. Each of the row controller circuits maintains the corresponding one of the p rows of memory cells in an asserted state upon sensing a write operation for the corresponding one of the p rows of memory cells, and upon sensing a read operation for the corresponding one of the p rows of memory cells subsequent to the write operation. Each of the row controller circuits forces the corresponding one of the p rows of memory cells to a non-asserted state upon sensing a read operation for the corresponding one of the p rows of memory cells when no previous write operation has taken place for the corresponding one of the p rows of memory cells. The enabling circuit is connected to the setting cell circuit and the row controller circuits. The enabling circuit disables the setting cell circuit so that data can be written into and read from the array of memory cells when any one of the p rows of memory cells is in the asserted state. The enabling circuit enables the setting cell circuit so that the preset logic state value is output to the data lines when all of the p rows of memory cells are in the non-asserted state during a read cycle.

According to a further illustrative preferred embodiment of the present invention, a presettable semiconductor memory device comprises an array of memory cells, a row address decoder, a column controller circuit, a setting cell circuit, and an enabling circuit. The array of memory cells is arranged in p rows and one column. The column has a corresponding set of data lines. The row address decoder is connected to the array of memory cells and outputs row select signals to control access to the p corresponding rows of memory cells. The column controller circuit is connected to the array of memory cells and the row address decoder. The column controller circuit is responsive to the row select signals to control switching of the data lines to a set of bit lines. The column controller circuit controls the switching of the data lines for connection of the data lines to the bit lines upon sensing a write operation for the column of memory cells, and upon sensing a read operation for the column of memory cells subsequent to the write operation. The column controller circuit further controls the switching of the data lines for disconnection of the data lines from the bit lines upon sensing a read operation for the column of memory cells when no previous write operation has taken place for the column of memory cells. The setting cell circuit is connected to the bit lines and is capable of being enabled to output a preset logic state value to the bit lines. The enabling circuit is connected to the setting cell circuit and the column controller circuit. The enabling circuit disables the setting cell circuit so that data can be written into and read from the array of memory cells when the data lines are switched for connection with the bit lines. The enabling circuit enables the setting cell circuit so that the preset logic state value is output to the bit lines when the data lines are switched for disconnection from the bit lines during a read cycle.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
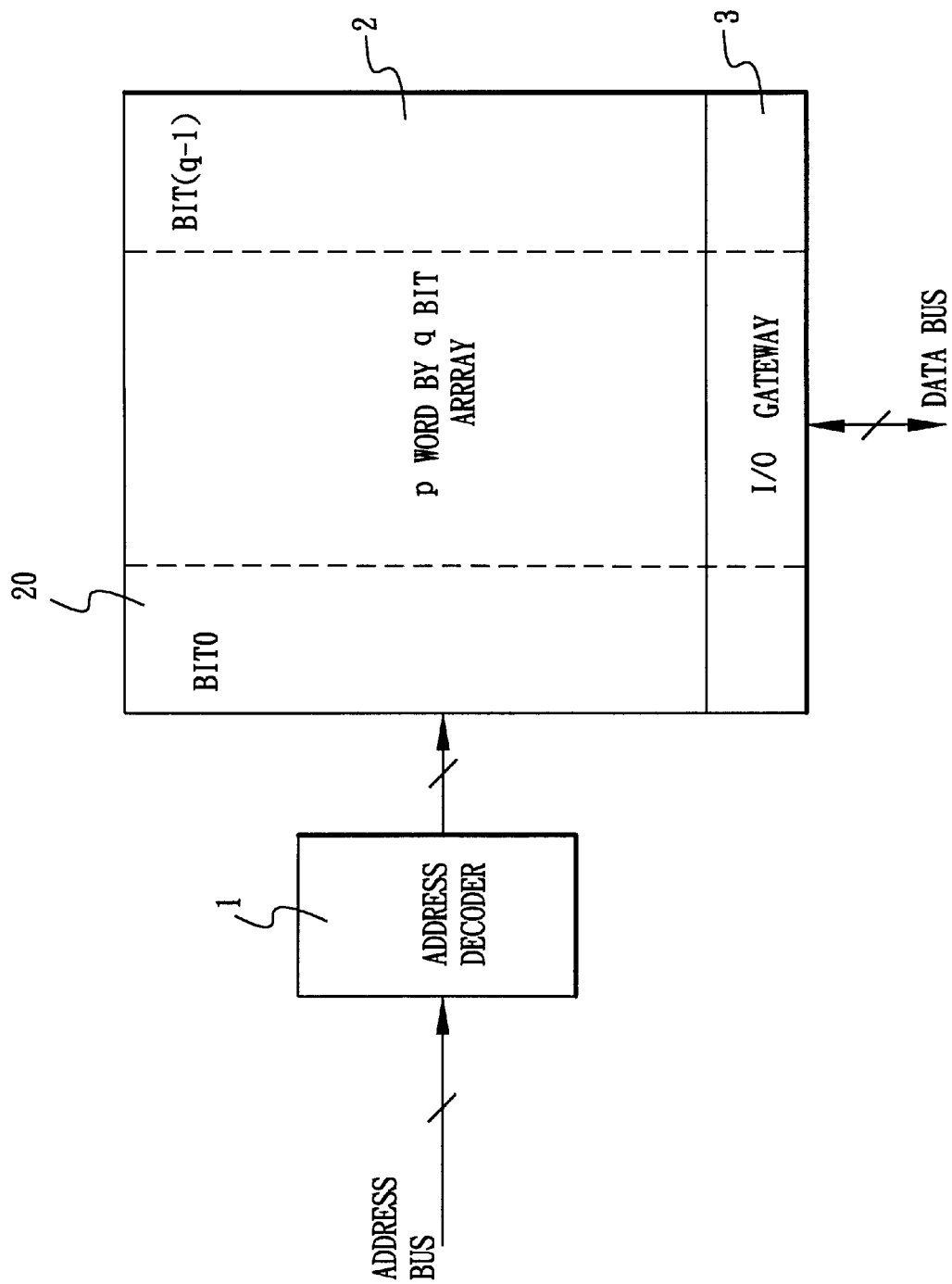
FIG. 1 shows a block diagram of a conventional semiconductor memory device.

Before the present invention is described in greater detail, it should be noted that like elements are denoted by the same reference numerals throughout the disclosure.

Figure 2:
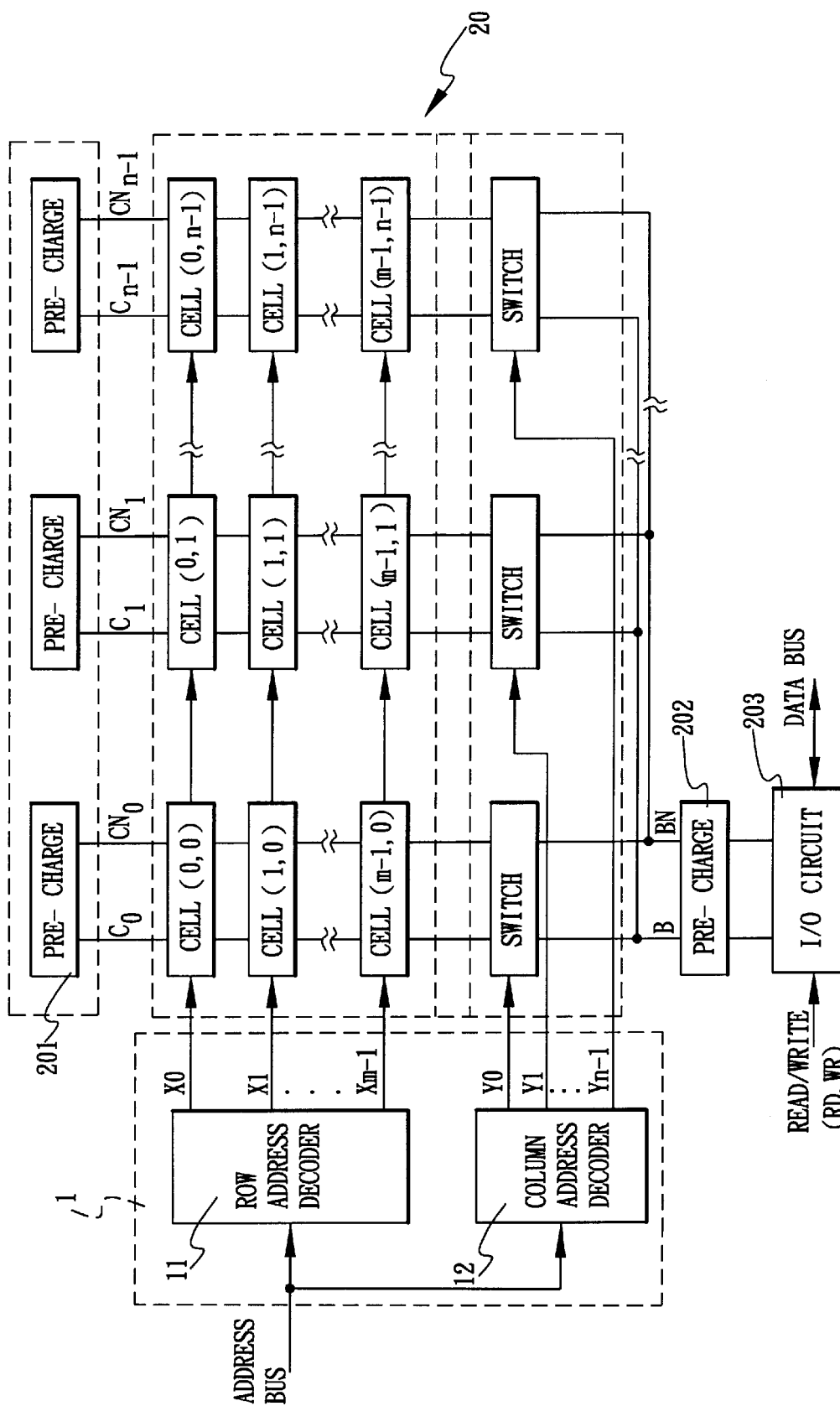
FIG. 2 is a block diagram illustrating in greater detail a single bit of a conventional SRAM array according to FIG. 1.
Figure 3:
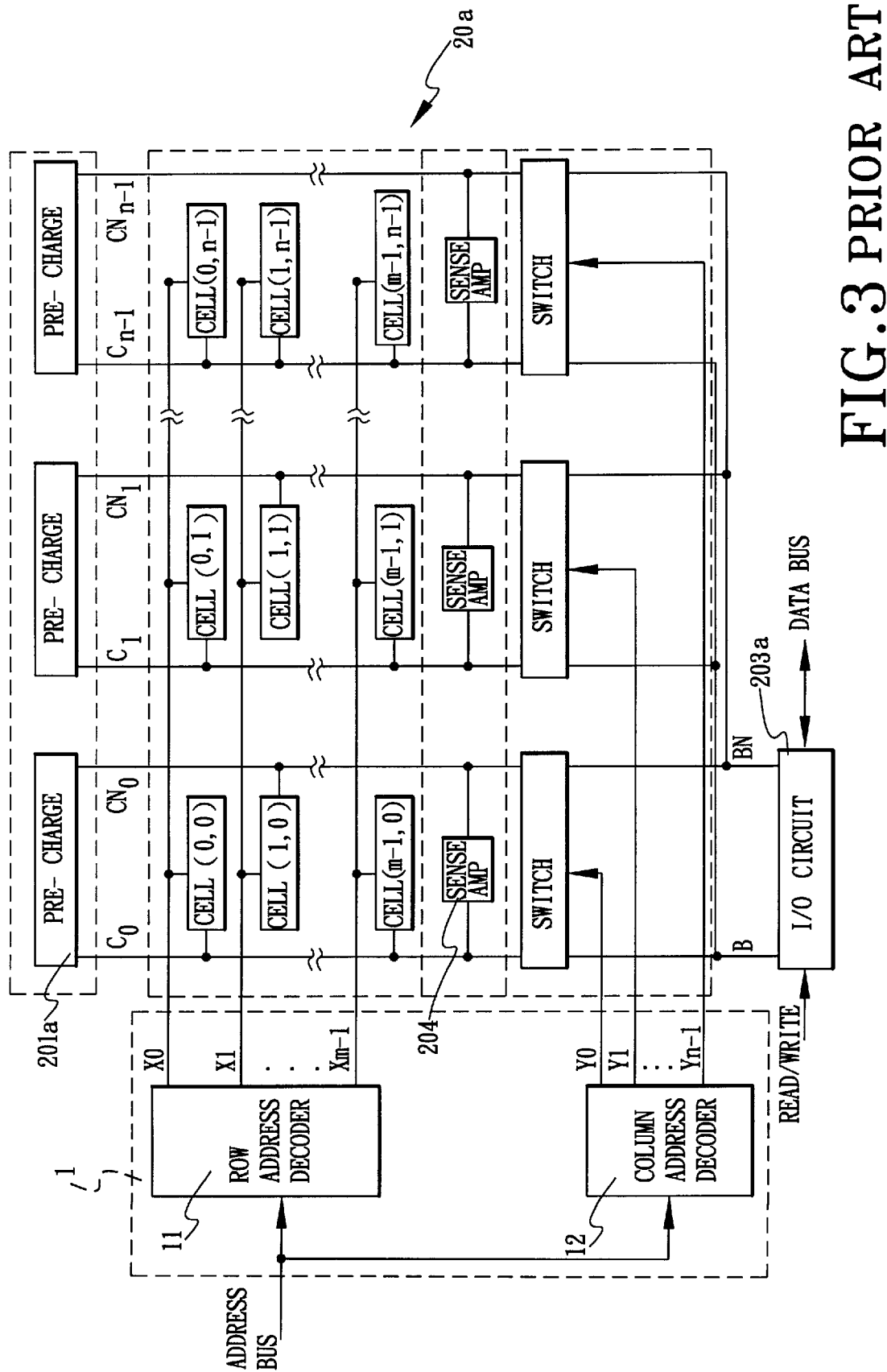
FIG. 3 is a block diagram illustrating in greater detail a single bit of a conventional DRAM array according to FIG. 1.
Figure 4:
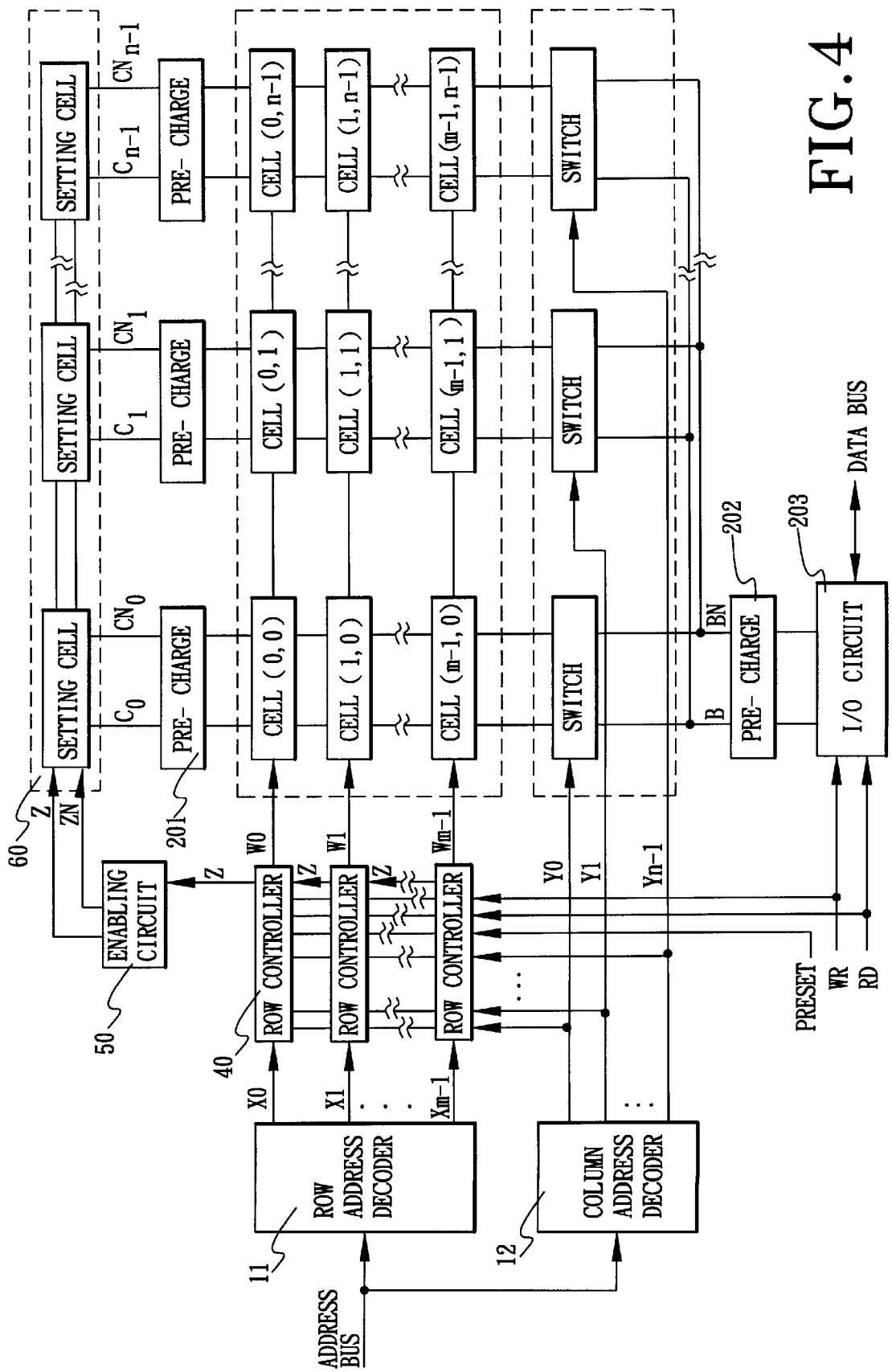
FIG. 4 is a block diagram of the first preferred embodiment of a semiconductor memory device according to the present invention.

FIG. 4 shows a block diagram of the first preferred embodiment of a semiconductor memory device according to the present invention, which is a modified version of the single bit block diagram of FIG. 2. The preferred embodiment of FIG. 4 includes a row controller circuit (e.g. 40) associated with each of the row select lines X0, X1, . . . Xm−1 from the row address decoder 11, a setting cell circuit (e.g. 60) associated with each of the data line pairs C0, CN0; C1, CN1; . . . Cn−1, CNn−1; and an enabling circuit 50. The array core is similar to that shown in FIG. 2, which includes the m by n array cells, the pre-charge cells, e.g. 201, 202, the data line switches and the I/O circuit 203. The row select lines of the array core are driven by signal lines W0, W1, . . . Wm−1 from the row controller circuits.

Figure 5A:
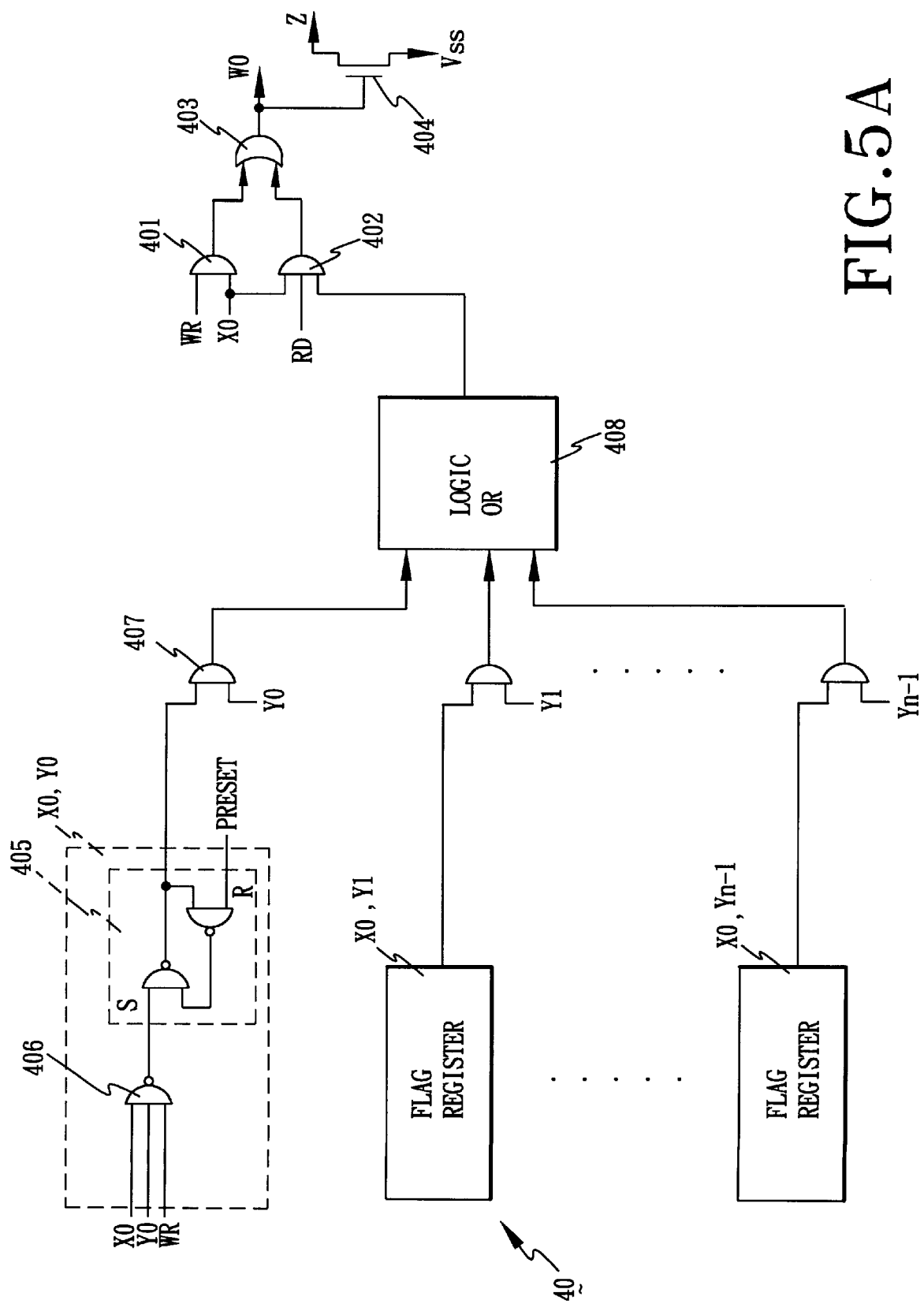
FIG. 5A is a schematic circuit diagram illustrating a row controller circuit of the first preferred embodiment.
Figure 5:
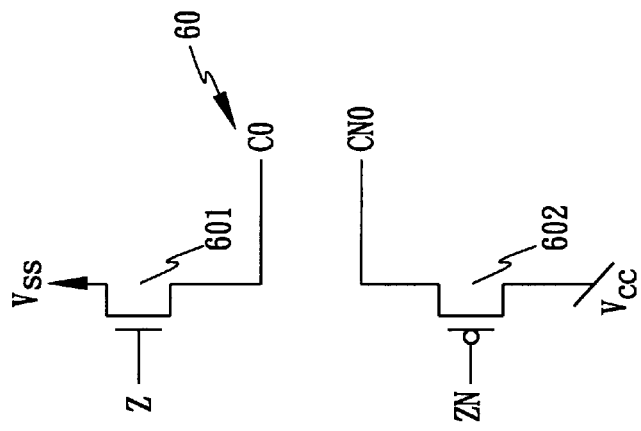
FIG. 5B is a schematic circuit diagram illustrating an enabling circuit of the first preferred embodiment.
FIG. 5C is a schematic circuit diagram illustrating a setting cell circuit of the first preferred embodiment.
Figure 5:
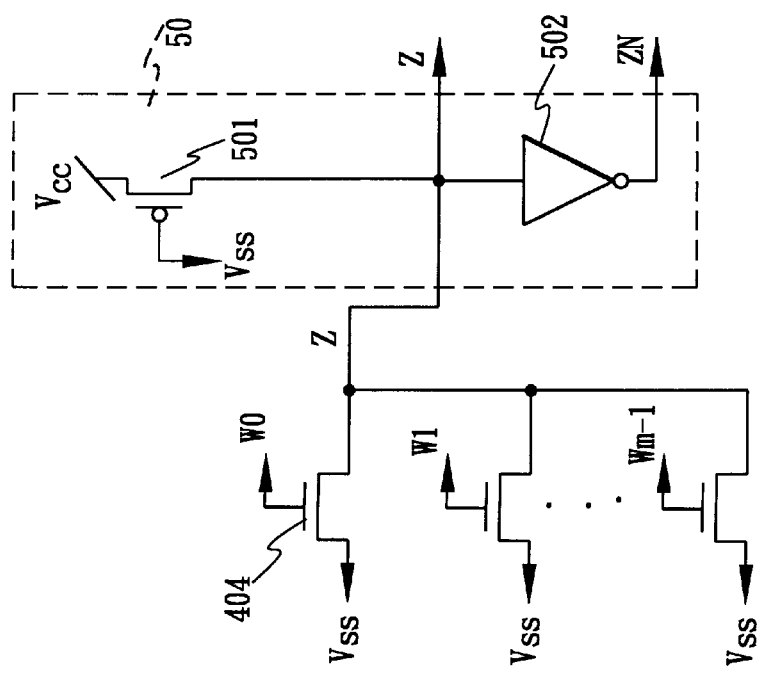

FIG. 5A is a schematic circuit diagram illustrating the row controller circuit 40 that corresponds to the first row select line X0 in FIG. 4. Within row controller circuit 40, there are n resettable flag registers (X0, Y0; X0, Y1; . . . X0, Yn−1) which correspond to the n memory cells (0,0; 0,1; . . . 0,n−1) associated with row select line X0 in FIG. 4. Each flag register (X0, Y0; X0, Y1; . . . X0, Yn−1) comprises an RS latch 405 and a NAND gate 406. NAND gate 406 has three inputs, namely row select line X0, the corresponding column select line Yj (where j=0 to n−1) and a write control signal WR. The output of NAND gate 406 is connected to a set terminal S of RS latch 405. A reset terminal R of RS latch 405 is connected to a PRESET control line so that RS latch 405 can be reset by a PRESET control signal. Each of an n number of AND gates 407 performs a logic AND operation of the output of the RS latch 405 of the corresponding flag register (X0, Yj) and the corresponding column select line Yj. An n-input logic OR circuit 408 performs a logic OR operation of the outputs of the AND gates 407. AND gate 401 receives two inputs, i.e. row select line X0 and the write control signal WR. AND gate 402 receives three inputs, i.e. row select line X0, a read control signal RD, and the output of logic OR circuit 408. OR gate 403 receives the outputs of AND gates 401, 402, and drives the signal line W0. Therefore, AND gates 401, 402 and OR gate 403 operate as a combinational logic circuit for determining whether to implement the assertion of row select line X0 onto signal line W0, or to force signal line W0 to a non-asserted state. The operations associated with the row controller circuit 40 will be described in greater detail in the succeeding paragraphs.

An NMOS transistor 404 functions as a pull-down transistor between signal line W0 and an output signal line Z. As shown in FIG. 5B, NMOS transistor 404 is in parallel with the NMOS transistors of all m number of row controller circuits, and forms a logic NOR circuit to the output signal line Z, in conjunction with a single weak common pull-up PMOS transistor 501 of the enabling circuit 50. The logic state of the output signal line Z is thus the result of a logic NOR operation of the signal lines W0, W1, . . . Wm−1. This decimated logic NOR circuit configuration, where an NMOS transistor is associated with each row select line and shares the output signal line Z with all m number of row controller circuits, does not require m input lines, in contrast to a conventional m input NOR gate. The use of a conventional m input NOR gate would complicate the regular routing of word lines, and would require a considerable amount of silicon area. Thus, the inventive NOR gate decimation provides reduction in both gate count and layout space requirements.

Referring again to FIG. 5B, aside from the PMOS transistor 501, the enabling circuit 50 further includes an inverter 502. The drain of PMOS transistor 501 is connected to output signal line Z and to the input of inverter 502. As such, the output Zn of inverter 502 is the opposite logic state of output signal line Z. As shown in FIG. 5C, the setting cell circuit 60 is used to provide a preset logic value on the data lines C0, CN0, and includes a pull-down NMOS transistor 601 and a pull-up PMOS transistor 602 having gate terminals connected respectively to output signal lines Z, Zn, and drain terminals connected respectively to the data lines C0, CN0. When Z=1 and Zn=0, C0=0 and CN0=1, representing a logic 0 state on the data lines. Importantly, the setting cell drain connections can be reversed to place a preset logic 1 value on the data lines C0, CN0.

The operation of the first preferred embodiment will now be described in greater detail as follows:

Initially, when the PRESET control signal is applied to the reset terminal R of RS latch 405 of the flag registers (X0, Y0; X0, Y1; . . . X0, Yn−1), the outputs of the flag registers are at the logic 0 state, and the outputs of AND gate 407 and logic OR circuit 408 are similarly at a logic 0 state. Under this condition, when row select line X0 is selected in the presence of the read control signal RD, signal line W0 is maintained in a non-asserted state.

When row select line X0 is selected in the presence of the write control signal WR, signal line W0 is driven to the asserted state via AND gate 401 and OR gate 403. At the same time, the output of the RS latch 405 of the flag register (X0, Y0; X0, Y1; . . . X0, Yn−1) corresponding to the selected column select line Yj (where j=0 to n−1) will be set to a logic 1 state.

Flag register (X0, Yj) acts to indicate whether or not a write command has been issued to the corresponding memory cell (0, j) in the array core, and is not reset unless the PRESET control signal is present. Thus, when it is desired to read the contents of memory cell (0, j) after the corresponding flag register (X0, Yj) has been set to a logic 1 state, the output of logic OR circuit 408 changes to a logic 1 state. Signal line W0 is thus driven to the asserted state via AND gate 402 and OR gate 403.

Referring to FIGS. 5B and 5C, assuming that none of the signal lines W0, W1, . . . Wm−1 is in an asserted state, output signal line Z is pulled to a logic 1 state by the PMOS transistor 501, output signal line Zn is at a logic 0 state, and a logic 0 state is applied on the data lines C0, CN0 by the setting cell circuit 60. When any one of the signal lines W0, W1, . . . Wm−1 is in an asserted state, setting cell circuit 60 is disabled by the enabling circuit 50 so that the contents of the selected memory cell can be sensed at the data lines C0, CN0.

It has thus been shown that, after the write control signal WR sets one of the flag registers to flag a corresponding address of the array core, the asserted state of the signal line W0 is maintained in a subsequent read cycle for reading the data of memory cells that are associated with the flagged address. Conversely, when reading a non-flagged address of the array core, signal line W0 remains in a non-asserted state, thereby disabling the memory cells and applying the preset logic state of the setting cell circuit 60 on the data lines C0, CN0.

Figure 6:
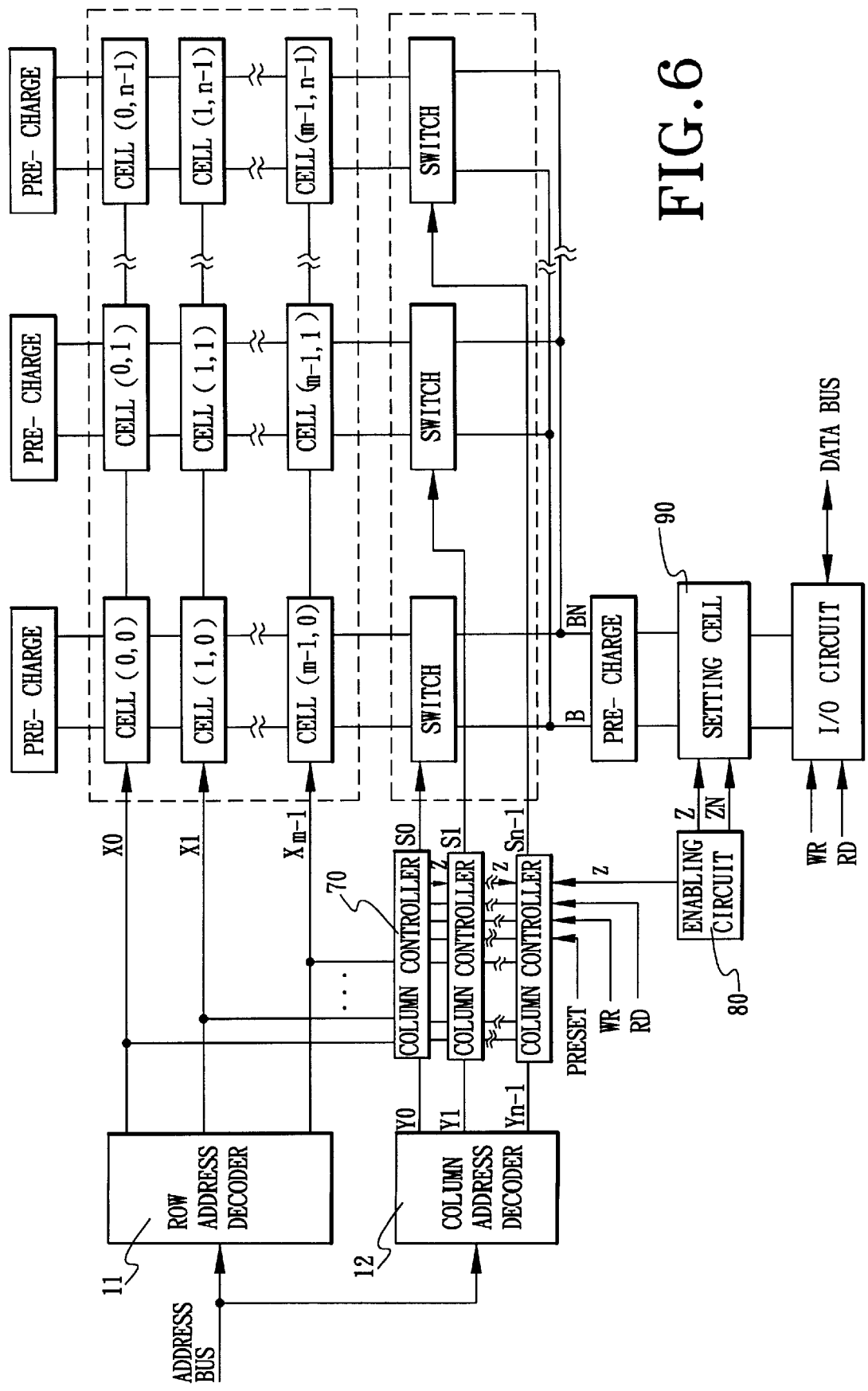
FIG. 6 is a block diagram of the second preferred embodiment of a semiconductor memory device according to the present invention.
Figure 7A:
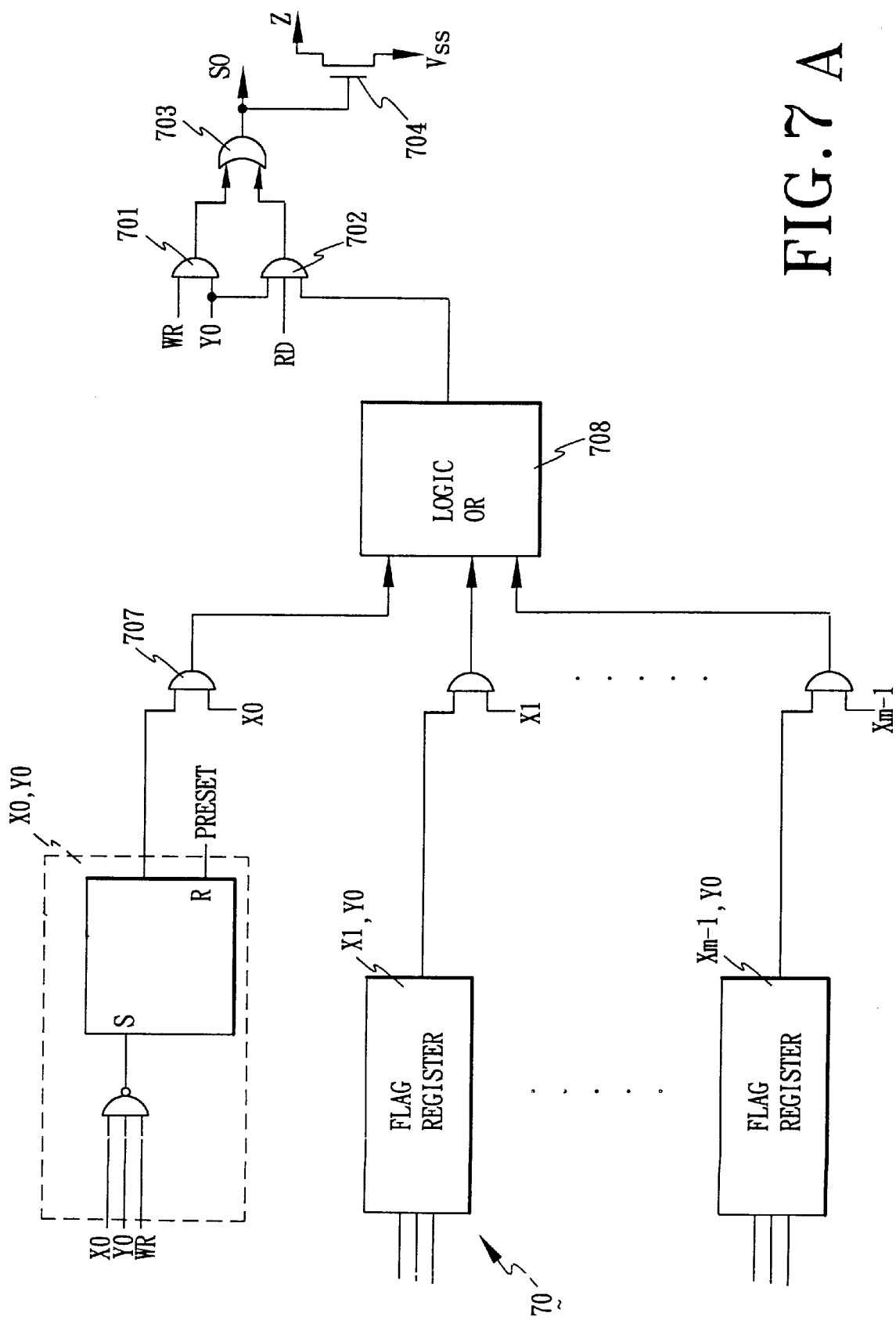
FIG. 7A is a schematic circuit diagram illustrating a column controller circuit of the second preferred embodiment.
Figure 7C:
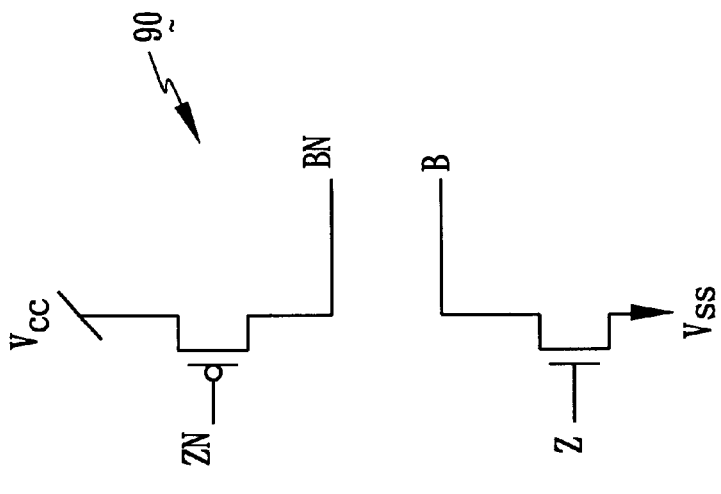
FIG. 7C is a schematic circuit diagram illustrating a setting cell circuit of the second preferred embodiment.
Figure 7B:
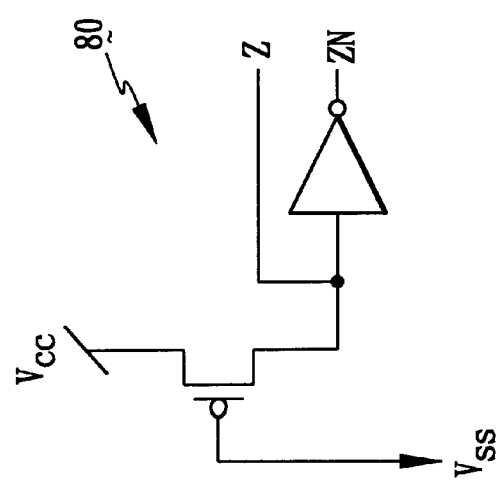
FIG. 7B is a schematic circuit diagram illustrating an enabling circuit of the second preferred embodiment.

FIGS. 6, 7A, 7B and 7C illustrate the second preferred embodiment of a semiconductor memory device according to the present invention. The second preferred embodiment includes a column controller circuit (e.g 70) associated with each of the column select lines Y0, Y1, . . . Yn−1 from the column address decoder 12, instead of the row controller circuits for the row select lines as taught in the first preferred embodiment. The column select lines of the array core are driven by signal lines S0, S1, . . . Sn−1 from the column controller circuits. The column controller circuit 70 that corresponds to the first column select line Y0 in FIG. 6 is shown in greater detail in FIG. 7A. Note that the configuration of the column controller circuit 70 is very similar to that of the row controller circuit 40 shown in FIG. 5A. As illustrated, within column controller circuit 70, there are m resettable flag registers (X0, Y0; X1, Y0; ... Xm−1, Y0) which correspond to the m memory cells (0,0; 1,0; ... m−1,0) associated with column select line Y0 in FIG. 6. Each of an m number of AND gates 707 performs a logic AND operation of the output of one of the flag registers (Xi, Y0) (where i=0 to m−1) and the corresponding row select line Xi. An m-input logic OR circuit 708 performs a logic OR operation of the outputs of the AND gates 707. AND gate 701 receives two inputs, i.e. column select line Y0 and the write control signal WR. AND gate 702 receives three inputs, i.e. column select line Y0, the read control signal RD, and the output of logic OR circuit 708. OR gate 703 receives the outputs of AND gates 701, 702, and drives the signal line S0. An NMOS transistor 704 functions as a pull-down transistor between signal line S0 and an output signal line Z. A setting cell circuit 90 is associated with the bit lines B, BN. Thus, unlike the previous embodiment, where each setting cell circuit is associated with a corresponding one of the data line pairs Cj, CNj (where j=0 to n−1), only one setting cell circuit 90 is required for each single bit of the array core. An enabling circuit 80 is connected to the output signal line Z and further provides the output signal Zn to the setting cell circuit 90. The details of the enabling circuit 80 and the setting cell circuit 90, as shown respectively in FIGS. 7B and 7C, are similar to those of the enabling circuit 50 and the setting cell circuit 60 of FIGS. 5B and 5C. FIG. 7C shows setting cell circuit 90 as a logic 0 cell. By reversing the drain connections in FIG. 7C, the setting cell circuit 90 becomes a logic 1 cell.

The operation of the second preferred embodiment is analogous to that of the first preferred embodiment. That is, after the write control signal WR sets one of the flag registers of the column controller circuit 70 to flag a corresponding address of the array core, the asserted state of the signal line S0 is maintained in a subsequent read cycle for reading the data of memory cells that are associated with the flagged address. Conversely, when reading a non-flagged address of the array core, signal line S0 remains in a non-asserted state, thereby disabling the memory cells and applying the preset logic state of the setting cell circuit 90 on the bit lines B. BN.

Figure 8:
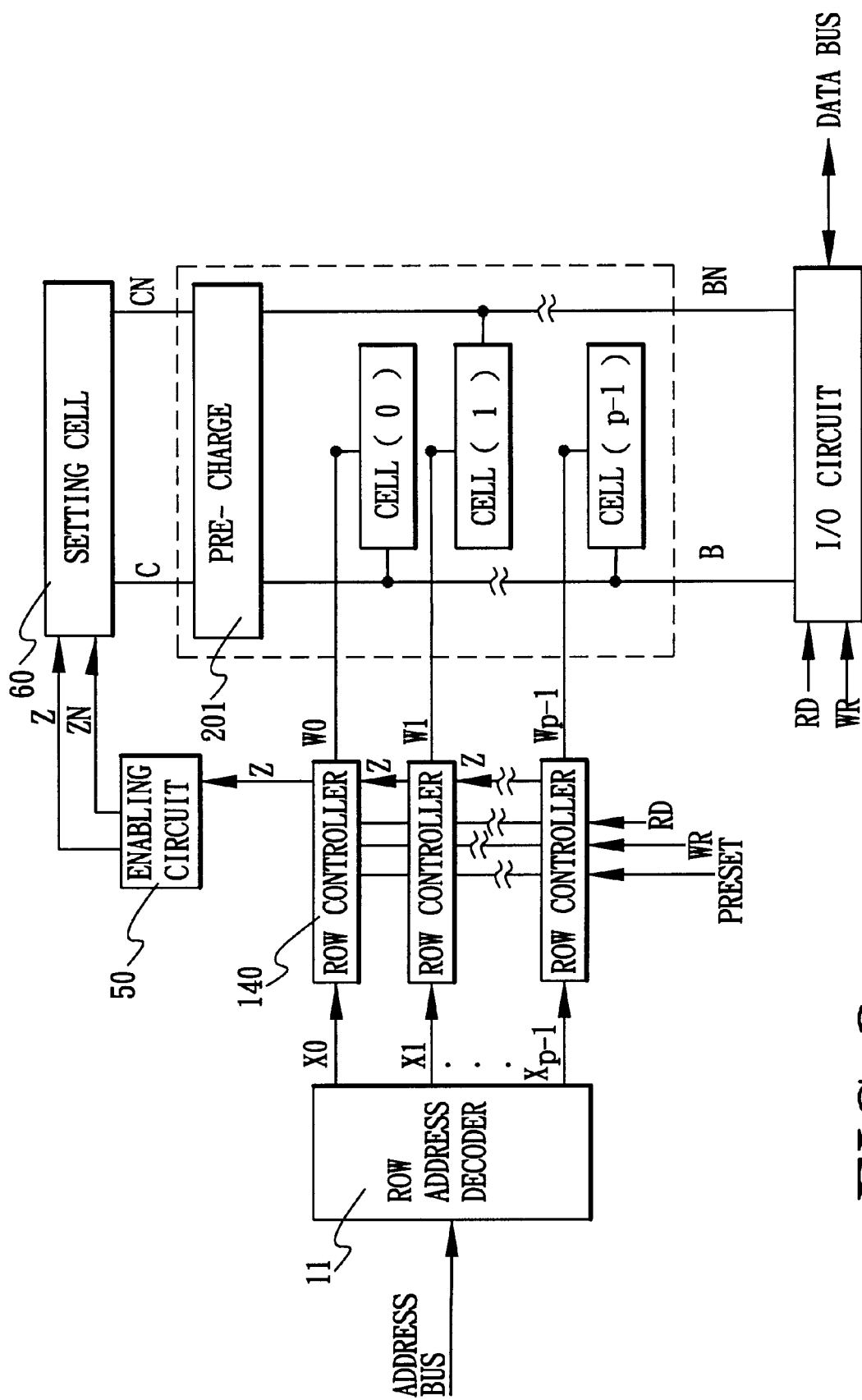
FIG. 8 is a block diagram of the third preferred embodiment of a semiconductor memory device according to the present invention.

FIG. 8 shows the third preferred embodiment of a semiconductor memory device according to the present invention. Unlike the first preferred embodiment, there is only one column of p memory cells per single bit of the array core (i.e., n=1). Thus, column selection is no longer needed, and the column address decoder is omitted. Moreover, the array core comprises an array of DRAM cells instead of SRAM cells. Each of a number p of row controller circuits (e.g. 140) is associated with a corresponding row select line X0, X1, ... Xp−1 from the row address decoder 11. A setting cell circuit 60 is associated with a single pair of data lines C, CN that is identical to the pair of bit lines B. BN. The semiconductor memory device further includes an enabling circuit 50.

Figure 9:
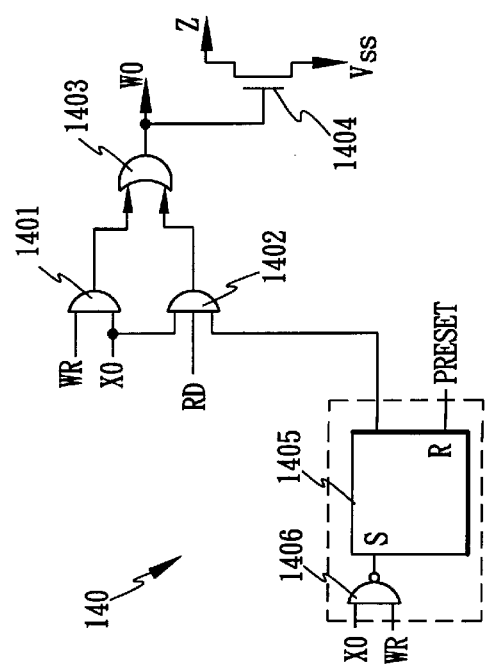
FIG. 9 is a schematic circuit diagram illustrating a row controller circuit of the third preferred embodiment.

The row controller circuit 140 that corresponds to the first row select line X0 in FIG. 8 is shown in greater detail in FIG. 9. Unlike the row controller circuit 40 of FIG. 5A, the row controller circuit 140 includes a single resettable flag register having a two-input NAND gate 1406 and an RS latch 1405. The inputs of NAND gate 1406 are row select line X0 and the write control signal WR. The output of NAND gate 1406 is connected to a set terminal S of RS latch 1405. The reset terminal R of RS latch 1405 is connected to the PRESET control line. A combinational logic circuit includes AND gates 1401, 1402 and OR gate 1403. AND gate 1401 has the write control signal WR and row select line X0 as its inputs. AND gate 1402 has row select line X0, the read control signal RD, and the output of RS latch 1405 as its inputs. OR gate 1403 receives the outputs of AND gates 1401, 1402, and drives the signal line W0. NMOS transistor 1404 functions as a pull-down transistor between signal line W0 and an output signal line Z.

As for the details of the enabling circuit 50 and the setting cell circuit 60, they are similar to the enabling circuit 50 (see FIG. 5B) and the setting cell circuit 60 (see FIG. 5C) of the first preferred embodiment.

Since the operation of the third preferred embodiment is generally similar to that of the first preferred embodiment, a detailed description of the same will be omitted herein.

Figure 10:
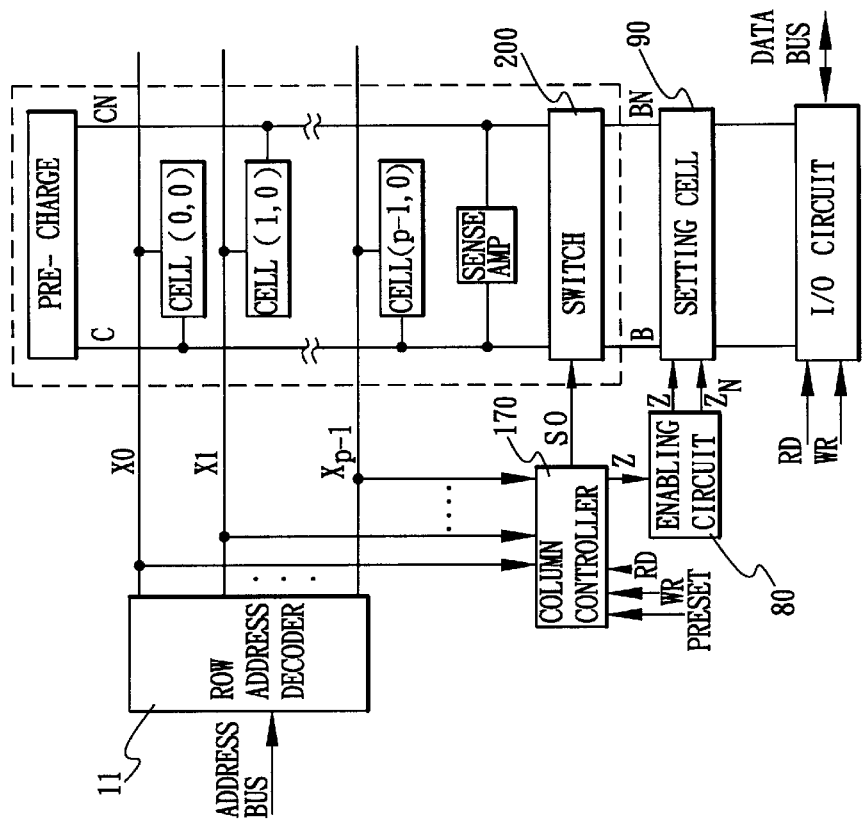
FIG. 10 is a block diagram of the fourth preferred embodiment of a semiconductor memory device according to the present invention.

FIG. 10 shows the fourth preferred embodiment of a semiconductor memory device according to the present invention. Unlike the second preferred embodiment, there is only one column of p memory cells per single bit of the array core (i.e., n=1). Thus, column selection is no longer needed, and the column address decoder is omitted. Moreover, like the third preferred embodiment, the array core comprises an array of DRAM cells instead of SRAM cells. The array core includes a switch 200 for on/off control of the connection between the data lines C, CN and the bit lines B, BN. A single column controller circuit 170 is associated with the row select lines X0, X1, ... Xp−1 from the row address decoder 11. A setting cell circuit 90 is associated with the pair of bit lines B, BN. The semiconductor memory device further includes an enabling circuit 80.

Figure 11:
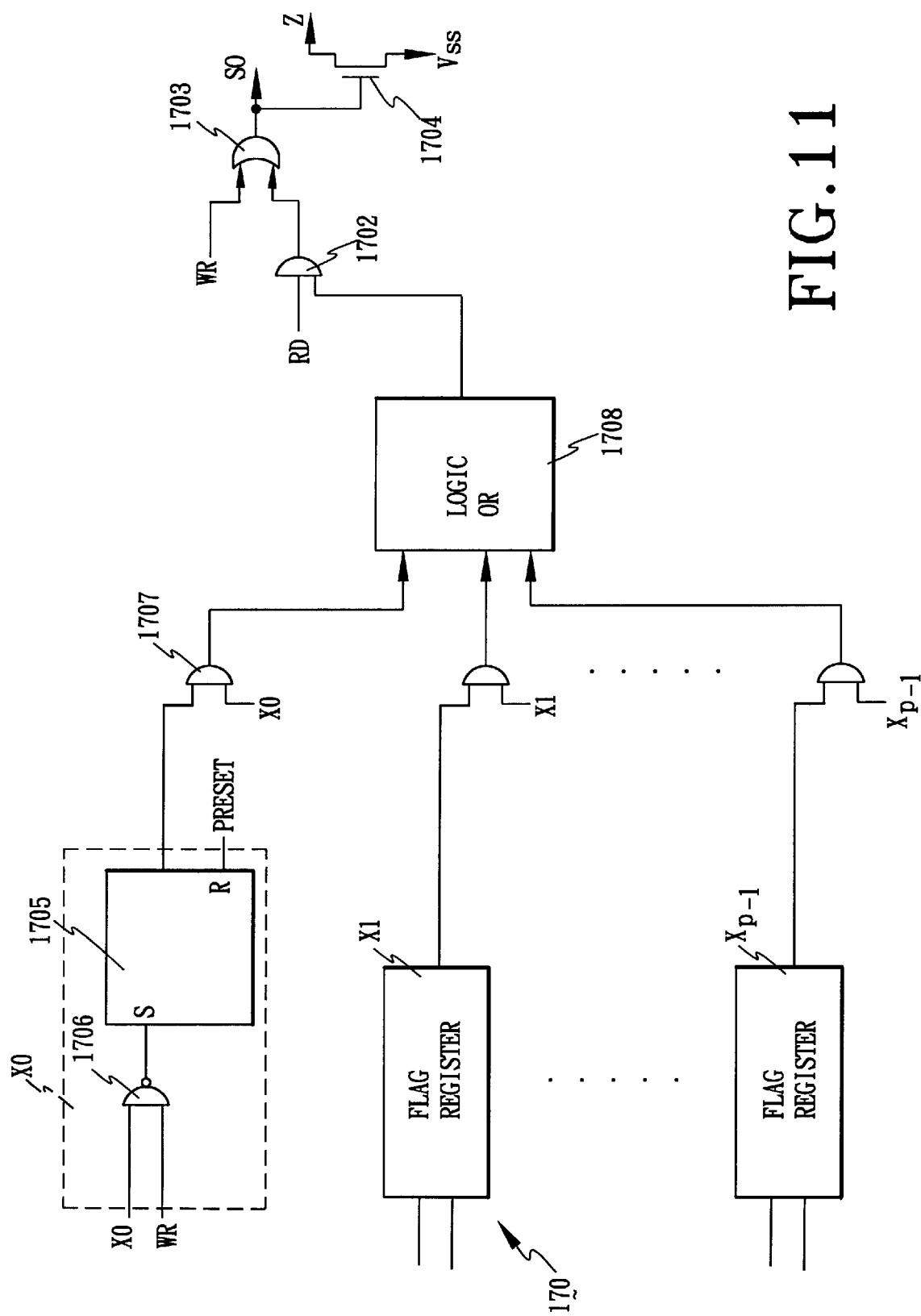
FIG. 11 is a schematic circuit diagram illustrating a column controller circuit of the fourth preferred embodiment.

The column controller circuit 170 is shown in greater detail in FIG. 11. As shown, column controller circuit 170 includes a number p of resettable flag registers, each of which has a two-input NAND gate 1706 and an RS latch 1705. The inputs of NAND gate 1706 are the corresponding row select line Xi (where i=1 to p−1) and the write control signal WR. The output of NAND gate 1706 is connected to a set terminal S of RS latch 1705. The reset terminal R of RS latch 1705 is connected to the PRESET control line. Each of a number p of AND gates 1707 performs a logic AND operation of the output of the RS latch 1705 of the corresponding flag register and the corresponding row select line Xi. A p-input logic OR circuit 1708 performs a logic OR operation of the outputs of the AND gates 1707. AND gate 1702 has the read control signal RD and the output of logic OR circuit 1708 as its inputs. OR gate 1703 receives the write control signal WR and the output of AND gate 1702, and drives the signal line S0. NMOS transistor 1704 functions as a pull-down transistor between signal line S0 and an output signal line Z. The details of the enabling circuit 80 and the setting cell circuit 90 are similar to those of the enabling circuit 80 (see FIG. 7B) and the setting cell circuit 90 (see FIG. 7C) of the second preferred embodiment. NMOS transistor 1704 and the weak pull-up PMOS transistor of the enabling circuit 80 (see FIG. 7B) form an inverter. In this single column configuration, layout space is not a significant issue. As such, these two transistors can be used as an inverter, with an input S0 and an output Z.

Since the operation of the fourth preferred embodiment is generally similar to that of the second preferred embodiment, a detailed description of the same will be omitted herein.

In short, a semiconductor memory device, such as an SRAM device or a DRAM device, is disclosed which can output a preset state without the need for performing an initial write operation on each cell of a memory cell array. Moreover, the disclosed semiconductor memory device can be preset with any combination of logic states.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A presettable semiconductor memory device, comprising:

an array of memory cells, arranged in m rows and n columns, each of said n columns having a corresponding set of data lines;

a row address decoder for outputting row select signals;

a column address decoder connected to said array of memory cells and outputting column select signals that are used to control switching of said sets of data lines of said n columns of memory cells to a common set of bit lines;

a number n of setting cell circuits, each of said setting cell circuits being connected to said data lines of a corresponding one of said n columns of memory cells, said setting cell circuits being capable of being enabled to output a preset logic state value to said data lines of said corresponding one of said n columns of memory cells;

a number m of row controller circuits connected to said array of memory cells, said row address decoder and said column address decoder, said row controller circuits corresponding to said m rows of memory cells and being responsive to said row and column select signals to control access to said m corresponding rows of memory cells;

each of said row controller circuits maintaining the corresponding one of said m rows of memory cells in an asserted state upon sensing a write operation for the corresponding one of said m rows of memory cells, and upon sensing a read operation for the corresponding one of said m rows of memory cells subsequent to the write operation;

each of said row controller circuits forcing the corresponding one of said m rows of memory cells to a non-asserted state upon sensing a read operation for the corresponding one of said m rows of memory cells when no previous write operation has taken place for the corresponding one of said m rows of memory cells; and an enabling circuit connected to said setting cell circuits and said row controller circuits, said enabling circuit disabling said setting cell circuits so that data can be written into and read from said array of memory cells when any one of said m rows of memory cells is in the asserted state, said enabling circuit enabling said setting cell circuits so that the preset logic state value is output to said data lines of said n columns of memory cells when all of said m rows of memory cells are in the non-asserted state during a read cycle.

2. The presettable semiconductor memory device as claimed in claim 1, wherein each of said row controller circuits includes a number n of resettable flag registers, each of said flag registers corresponding to said n memory cells in the corresponding one of said m rows of said array of memory cells, wherein each of said flag registers is in a set state when the corresponding one of said n memory cells is written to by means of a write control signal so as to permit the asserted state to be maintained on the corresponding one of said m rows of memory cells, and wherein each of said flag registers is maintained in a reset state when no previous write operation has taken place for the corresponding one of said n memory cells so as to permit the corresponding one of said m rows of memory cells to be forced to the non-asserted state.

3. The presettable semiconductor memory device as claimed in claim 1, wherein each of said setting cell circuits is configured to output one of a logic 0 and a logic 1 to said corresponding set of data lines.

4. The presettable semiconductor memory device as claimed in claim 1, wherein each of said row controller circuits has an output circuit connected to said enabling circuit and to said output circuits of other ones of said row controller circuits at a common node to form a logic NOR circuit that inputs a single activating signal to said enabling circuit.

5. The presettable semiconductor memory device as claimed in claim 1, wherein each of said sets of data lines and bit lines incorporates a pre-charge cell for voltage equalization.

6. The presettable semiconductor memory device as claimed in claim 1, wherein said array of memory cells includes an input/output circuit connected between said bit lines and a data bus, for passing data from said data bus to said bit lines upon receipt of a write control signal, and for passing data from said bit lines to said data bus upon receipt of a read control signal.

7. The presettable semiconductor memory device as claimed in claim 1, wherein said array of memory cells is an array of static random access memory (SRAM) cells.

8. The presettable semiconductor memory device as claimed in claim 1, wherein said array of memory cells is an array of dynamic random access memory (DRAM) cells.

9. A presettable semiconductor memory device, comprising:

an array of memory cells, arranged in m rows and n columns, each of said n columns having a corresponding set of data lines;

a row address decoder connected to said array of memory cells and outputting row select signals to control access to said m corresponding rows of memory cells;

a column address decoder for outputting column select signals;

a number n of column controller circuits connected to said array of memory cells, said row address decoder and said column address decoder, said column controller circuits corresponding to said n columns of memory cells and being responsive to said row and column select signals to control access to said n corresponding columns of memory cells and to control switching of said sets of data lines of said n columns of memory cells to a common set of bit lines;

each of said column controller circuits controlling the switching of said sets of data lines for connection of one of said sets of data lines to a common set of bit lines upon sensing a write operation for the corresponding one of said n columns of memory cells, and upon sensing a read operation for the corresponding one of said n columns of memory cells subsequent to the write operation;

each of said column controller circuits controlling the switching of said sets of data lines for disconnection of one of said sets of data lines from said bit lines upon sensing a read operation for the corresponding one of said n columns of memory cells when no previous write operation has taken place for the corresponding one of said n columns of memory cells;

a setting cell circuit connected to said bit lines and capable of being enabled to output a preset logic state value to said bit lines; and an enabling circuit connected to said setting cell circuit and said column controller circuits, said enabling circuit disabling said setting cell circuit so that data can be written into and read from said array of memory cells when any one of said sets of data lines is switched for connection with said bit lines, said enabling circuit enabling said setting cell circuit so that the preset logic state value is output to said bit lines when all of said sets of data lines are switched for disconnection from said bit lines during a read cycle.

10. The presettable semiconductor memory device as claimed in claim 9, wherein each of said column controller circuits includes a number m of resettable flag registers, each of said flag registers corresponding to said m memory cells in the corresponding one of said n columns of said array of memory cells, wherein each of said flag registers is in a set state when the corresponding one of said m memory cells is written to by means of a write control signal so as to permit control of the switching of the corresponding set of said data lines for connection to said bit lines, and wherein each of said flag registers is maintained in a reset state when no previous write operation has taken place for the corresponding one of said m memory cells so as to permit control of the switching of the corresponding set of said data lines for disconnection from said bit lines.

11. The presettable semiconductor memory device as claimed in claim 9, wherein said setting cell circuit is configured to output one of a logic 0 and a logic 1 to said bit lines.

12. The presettable semiconductor memory device as claimed in claim 9, wherein each of said column controller circuits has an output circuit connected to said enabling circuit and to said output circuits of other ones of said column controller circuits at a common node to form a logic NOR circuit that inputs a single activating signal to said enabling circuit.

13. The presettable semiconductor memory device as claimed in claim 9, wherein each of said sets of data lines and bit lines incorporates a pre-charge cell for voltage equalization.

14. The presettable semiconductor memory device as claimed in claim 9, wherein said array of memory cells includes an input/output circuit connected between said bit lines and a data bus, for passing data from said data bus to said bit lines upon receipt of a write control signal, and for passing data from said bit lines to said data bus upon receipt of a read control signal.

15. The presettable semiconductor memory device as claimed in claim 9, wherein said array of memory cells is an array of static random access memory (SRAM) cells.

16. The presettable semiconductor memory device as claimed in claim 9, wherein said array of memory cells is an array of dynamic random access memory (DRAM) cells.

17. A presettable semiconductor memory device, comprising:

an array of memory cells, arranged in p rows and one column, said column having a corresponding set of data lines;

a row address decoder for outputting row select signals;

a setting cell circuit connected to said data lines and capable of being enabled to output a preset logic state value to said data lines;

a number p of row controller circuits connected to said array of memory cells and said row address decoder, said row controller circuits corresponding to said p rows of memory cells and being responsive to said row select signals to control access to said p corresponding rows of memory cells;

each of said row controller circuits maintaining the corresponding one of said p rows of memory cells in an asserted state upon sensing a write operation for the corresponding one of said p rows of memory cells, and upon sensing a read operation for the corresponding one of said p rows of memory cells subsequent to the write operation;

each of said row controller circuits forcing the corresponding one of said p rows of memory cells to a non-asserted state upon sensing a read operation for the corresponding one of said p rows of memory cells when no previous write operation has taken place for the corresponding one of said p rows of memory cells; and an enabling circuit connected to said setting cell circuit and said row controller circuits, said enabling circuit disabling said setting cell circuit so that data can be written into and read from said array of memory cells when any one of said p rows of memory cells is in the asserted state, said enabling circuit enabling said setting cell circuit so that the preset logic state value is output to said data lines when all of said p rows of memory cells are in the non-asserted state during a read cycle.

18. The presettable semiconductor memory device as claimed in claim 17, wherein each of said row controller circuits includes a resettable flag register corresponding to said memory cell in the corresponding one of said p rows of said array of memory cells, wherein said flag register is in a set state when said corresponding memory cell is written to by means of a write control signal so as to permit the asserted state to be maintained on the corresponding one of said p rows of memory cells, and wherein said flag register is maintained in a reset state when no previous write operation has taken place for said corresponding memory cell so as to permit the corresponding one of said p rows of memory cells to be forced to the non-asserted state.

19. The presettable semiconductor memory device as claimed in claim 17, wherein said setting cell circuit is configured to output one of a logic 0 and a logic 1 to said data lines.

20. The presettable semiconductor memory device as claimed in claim 17, wherein each of said row controller circuits has an output circuit connected to said enabling circuit and to said output circuits of other ones of said row controller circuits at a common node to form a logic NOR circuit that inputs a single activating signal to said enabling circuit.

21. The presettable semiconductor memory device as claimed in claim 17, wherein said set of data lines incorporates a pre-charge cell for voltage equalization.

22. The presettable semiconductor memory device as claimed in claim 17, wherein said array of memory cells includes an input/output circuit connected between said data lines and a data bus, for passing data from said data bus to said data lines upon receipt of a write control signal, and for passing data from said data lines to said data bus upon receipt of a read control signal.

23. The presettable semiconductor memory device as claimed in claim 17, wherein said array of memory cells is an array of static random access memory (SRAM) cells.

24. The presettable semiconductor memory device as claimed in claim 17, wherein said array of memory cells is an array of dynamic random access memory (DRAM) cells.

25. A presettable semiconductor memory device, comprising:

an array of memory cells, arranged in p rows and one column, said column having a corresponding set of data lines;

a row address decoder connected to said array of memory cells and outputting row select signals to control access to said p corresponding rows of memory cells;

a column controller circuit connected to said array of memory cells and said row address decoder, said column controller circuit being responsive to said row select signals to control switching of said data lines to a set of bit lines;

said column controller circuit controlling the switching of said data lines for connection of said data lines to said bit lines upon sensing a write operation for said column of memory cells, and upon sensing a read operation for said column of memory cells subsequent to the write operation;

said column controller circuit controlling the switching of said data lines for disconnection of said data lines from said bit lines upon sensing a read operation for said column of memory cells when no previous write operation has taken place for said column of memory cells;

a setting cell circuit connected to said bit lines and capable of being enabled to output a preset logic state value to said bit lines; and an enabling circuit connected to said setting cell circuit and said column controller circuit, said enabling circuit disabling said setting cell circuit so that data can be written into and read from said array of memory cells when said data lines are switched for connection with said bit lines, said enabling circuit enabling said setting cell circuit so that the preset logic state value is output to said bit lines when said data lines are switched for disconnection from said bit lines during a read cycle.

26. The presettable semiconductor memory device as claimed in claim 25, wherein said column controller circuit includes a number p of resettable flag registers, each of said flag registers corresponding to said p memory cells in said column of memory cells, wherein each of said flag registers is in a set state when the corresponding one of said p memory cells is written to by means of a write control signal so as to permit control of the switching of said data lines for connection of said data lines to said bit lines, and wherein each of said flag registers is maintained in a reset state when no previous write operation has taken place for the corresponding one of said p memory cells so as to permit control of the switching of said data lines for disconnection of said data lines from said bit lines.

27. The presettable semiconductor memory device as claimed in claim 25, wherein said setting cell circuit is configured to output one of a logic 0 and a logic 1 to said bit lines.

28. The presettable semiconductor memory device as claimed in claim 25, wherein said set of data lines incorporates a pre-charge cell for voltage equalization.

29. The presettable semiconductor memory device as claimed in claim 25, wherein said array of memory cells includes an input/output circuit connected between said bit lines and a data bus, for passing data from said data bus to said bit lines upon receipt of a write control signal, and for passing data from said bit lines to said data bus upon receipt of a read control signal.

30. The presettable semiconductor memory device as claimed in claim 25, wherein said array of memory cells is an array of static random access memory (SRAM) cells.

31. The presettable semiconductor memory device as claimed in claim 25, wherein said array of memory cells is an array of dynamic random access memory (DRAM) cells.

32. A method of presetting a semiconductor memory device that has a memory cell array without need for writing a preset value into each cell of said memory cell array, comprising the steps of:

presetting a desired output state in at least one setting cell;

sensing occurrence of a write operation of said memory cells;

setting a write flag to indicate occurrence of the write operation;

if said write flag is set, outputting contents of said memory cells at a subsequent read cycle; and if said write flag is not set, outputting contents of said at least one setting cell at the subsequent read cycle.

* * * * *